United States Patent [19]

Hsu

[11] Patent Number: 5,693,552
[45] Date of Patent: Dec. 2, 1997

[54] METHOD FOR FABRICATING READ-ONLY MEMORY DEVICE WITH A THREE-DIMENSIONAL MEMORY CELL STRUCTURE

[75] Inventor: Chen-Chung Hsu, Tainan, Taiwan

[73] Assignee: United Microelectronics Corporation, Hsinchu, Taiwan

[21] Appl. No.: 639,441

[22] Filed: Apr. 29, 1996

[51] Int. Cl.[6] .................................. H01L 21/8246
[52] U.S. Cl. .................. 437/48; 439/45; 439/52; 439/203; 439/915
[58] Field of Search .................. 437/915, 48, 45, 437/203, 52; 257/390.39

[56] References Cited

U.S. PATENT DOCUMENTS

| | | | |
|---|---|---|---|
| 5,429,973 | 7/1995 | Hong | 437/48 |
| 5,460,987 | 10/1995 | Wen et al. | 437/48 |
| 5,510,287 | 4/1996 | Chen et al. | 437/52 |

*Primary Examiner*—Jey Tsai
*Attorney, Agent, or Firm*—Rabin, Champagne & Lynt, P.C.

[57] ABSTRACT

A ROM device with a 3-dimensional memory cell structure that allows a high packing density of memory cells in the ROM device. The ROM device includes a silicon substrate having a plurality of parallel trenches formed thereon. These trenches define mesa regions therebetween. Source/drain regions are then formed on the trenches and the mesa regions. Sidewall spacers are formed on lateral sides of selected trenches. A gate oxide layer is then formed over the silicon substrate. Gate layers are then formed on the gate oxide layers along a direction perpendicular to the trenches. These gate layers serve as word lines. The bit lines over the trenches and the mesa regions utilize channel areas between each neighboring pair of source/drain regions in the horizontal direction to define a plurality of horizontal memory cells at intersections with the word lines. Each horizontal memory cell can be programmed by ion implantation. Similarly, the bit lines on lateral sides of the mesa regions utilize channel areas between each neighboring pair of source/drain regions in the vertical direction to define a plurality of vertical memory cells at these intersections. Each vertical memory cell can be programmed by ion implantation.

7 Claims, 4 Drawing Sheets

METHOD FOR FABRICATING READ-ONLY MEMORY DEVICE WITH A THREE-DIMENSIONAL MEMORY CELL STRUCTURE

BACKGROUND OF THE INVENTION

1. Field of the Invention

The invention relates to read-only memory (ROM) devices, and more particularly, to a ROM device with a 3-dimensional memory cell structure for achieving a high packing density of memory cells in the ROM device, and also to a method for fabricating such a ROM device.

2. Description of the Background Art

Read-only memory (ROM) is a nonvolatile semiconductor memory widely used in computer and microprocessor systems for permanent storage of information that is repeatedly used, including programs and data. The fabrication of ROMs involves very complicated and time-consuming processes and requires costly equipment and material to achieve. Most ROMs are identical in semiconductor structure, except for the information stored therein. These ROMs are structured as an array of memory cells, each of which stores a bit of binary data, the value of which depends on whether the memory cell channel is open or closed. The manufacturer usually fabricates ROMs up to the stage just prior to the programming step and then stores the semi-finished ROM products in stock waiting for customer orders. A customer then can order ROM products from the manufacturer by furnishing the binary information that is to be stored in the ROM to the manufacturer, who then performs the programming of the customer-furnished binary information into the ROM, by electrical means in its factory. This completes the production of the ROM, which is then delivered to the customer. Such a procedure is now a standard method in the semiconductor industry for fabricating and selling ROMs.

It is a constant research effort by semiconductor manufacturers to develop methods of packing a high density of memory cells in a single ROM chip at low cost, so as to increase competitiveness in the market. Using conventional methods, however, the semiconductor structure for the memory cells includes polysilicon gate regions formed on the same 2-dimensional plane. Thus, the population of memory cells on the ROM chip is limited by the area of the chip, thus restricting the packing density.

Such a conventional ROM device is illustrated in FIGS. 1A–1C. As shown, the conventional ROM device includes a P-type silicon substrate 10 on which a plurality of N-type source/drain regions 11, gate oxide layer 12, and a plurality of polysilicon gate regions 13 are successively formed. In the terminology used herein, the term "source/drain region" refers to either a source region or a drain region since a source/drain region can be used interchangeably either as a source region or a drain region depending on the arrangement of the word lines and bit lines.

Based on the foregoing structure, the elements that are enclosed by the dashed squares 14 in FIG. 1A in combination define a memory cell for the ROM device. Referring particularly to FIG. 1C, in order to program a memory cell into a permanently OFF state, a photoresist layer 15 serving as a mask is formed on the wafer and then an ion implantation process is performed through the mask so as to close the channel 16 of the memory cell. The photoresist layer 15 prevents channels beneath it from being closed by the ion implantation process.

Based on the structure of the conventional ROM device, the polysilicon gate regions 13 can only be formed on the same 2-dimensional plane on the wafer, thus limiting the packing density of the memory cells in the ROM device. There exists, therefore, a need for a fabrication method that allows the memory cells in a ROM device to be formed as a 3-dimensional structure on the wafer such that the packing density of the memory cells in the ROM device can be significantly increased.

SUMMARY OF THE INVENTION

It is therefore an object of the invention to provide a ROM device with a 3-dimensional memory cell structure, so as to increase the packing density of the memory cells in the ROM device.

It is another object of the invention to provide a method for fabricating the foregoing ROM device.

In accordance with the foregoing and other objectives of the invention, a new and improved ROM device and a method for fabricating the ROM device are provided. A ROM device having a 3-dimensional memory cell structure according to an aspect of the invention includes a silicon substrate on which a number of parallel trenches are formed in a first direction, the trenches defining a number of mesa regions therebetween. A number of source/drain regions are formed along the same direction on the trenches and the mesa regions, and are connected to bit lines of the ROM device. A number of sidewall spacers are formed on selected lateral sides of the mesa regions. A gate oxide layer is located over the silicon substrate, the source/drain regions, and the sidewall spacers. A number of gate layers are formed over the gate oxide layer along a direction perpendicular to the trenches, wherein the gate layers serve as word lines for the ROM device. Adjacent pairs of the source/drain regions oriented in a substantially horizontal relation include a horizontal channel therebetween. Adjacent pairs of the source/drain regions oriented in a substantially vertical relation include a vertical channel therebetween. Intersections of horizontal channels, word lines, and bit lines form horizontal memory cells programmed with specific binary data. Intersections of vertical channels, word lines, and bit lines also form vertical memory cells programmed with specific binary data.

In the ROM device, the bit lines over the trenches and the mesa regions utilize channel areas between each neighboring pair of source/drain regions in the horizontal direction to form a plurality of horizontal memory cells at intersections with the word lines. Each of the horizontal memory cells is programmed by ion implantation with specified binary information. Similarly, the bit lines on lateral sides of the mesa regions utilize channel areas between each neighboring pair of source/drain regions in the vertical direction to form a plurality of vertical memory cells at intersections with the word lines. Each of the vertical memory cells is programmed by ion implantation with specified binary information.

A method for fabricating a ROM device having a 3-dimensional memory cell structure according to an aspect of the invention includes preparing a silicon substrate on which a number of parallel trenches are formed in a first direction, wherein the trenches define a number of mesa regions therebetween. A layer of silicon nitride is formed over the silicon substrate and the silicon nitride layer is partly etched away to define a number of horizontal channel regions on the trenches and mesa regions. A first ion implantation process is performed using the silicon nitride layer as mask to define a number of source/drain regions on the silicon substrate, with horizontal memory cells located between adjacent horizontal source/drain regions and vertical memory cells located between adjacent vertical source/ drain regions. A number of sidewall spacers are formed on lateral sides of the mesa regions, covering the vertical memory cells. At least one of the sidewall spacers is selectively removed. The vertical memory cells remaining covered by sidewall spacers are programmed into a permanently ON state, and the vertical memory cells not covered by sidewall spacers are programmed into a permanently OFF state. The silicon nitride layer is removed and then a gate oxide layer is formed over the silicon substrate. A polysilicon layer is formed over the trenches and the mesa regions in a direction perpendicular to the trenches, so as to define a plurality of word lines. A second ion implantation process is then performed on selected horizontal memory cells to program the selected horizontal memory cells into a permanently OFF state and further to program the unselected horizontal memory cells into a permanently ON state. Metallization layers are then formed to interconnect memory cells in the ROM device. The memory cells are thus formed on a 3-dimensional memory cell structure over the substrate, allowing the packing density of the ROM device to be significantly increased.

BRIEF DESCRIPTION OF DRAWINGS

The invention can be more fully understood by reading the subsequent detailed description of the preferred embodiments, with reference to the accompanying drawings, wherein.

DETAILED DESCRIPTION OF THE PREFERRED EMBODIMENT

FIGS. 2A–2G are schematic sectional diagrams depicting the steps involved in the method according to the invention of fabricating a ROM device having a 3-dimensional memory cell structure.

Figure 1A:
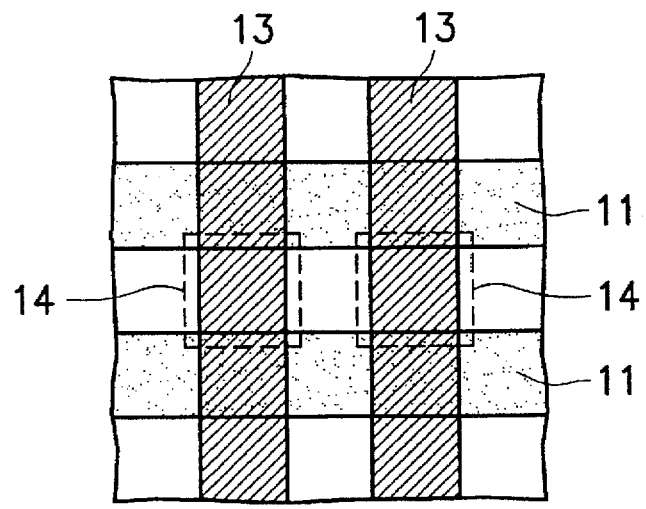
FIG. 1A is a schematic diagram showing the top view of a conventional ROM device.
Figure 1B:
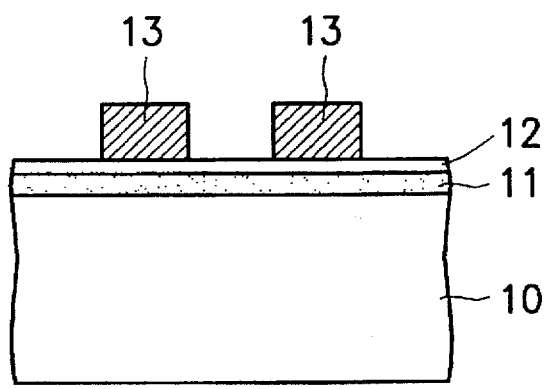
FIG. 1B is a schematic diagram showing a side view of the conventional ROM device of FIG. 1A.
Figure 1C:
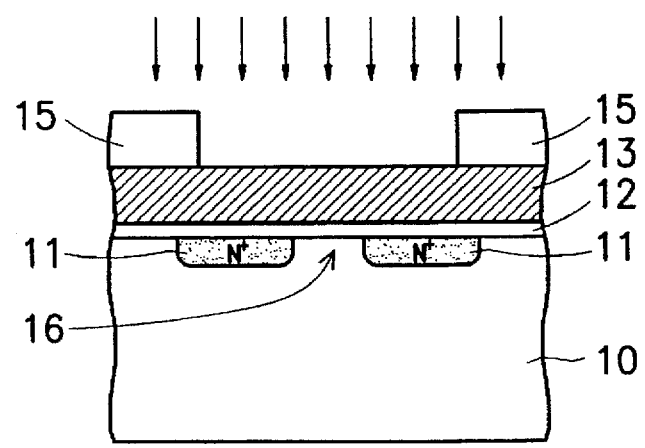
FIG. 1C is a schematic diagram showing another side view of the conventional ROM device of FIG. 1A with a photoresist layer formed thereon.
Figure 2A:
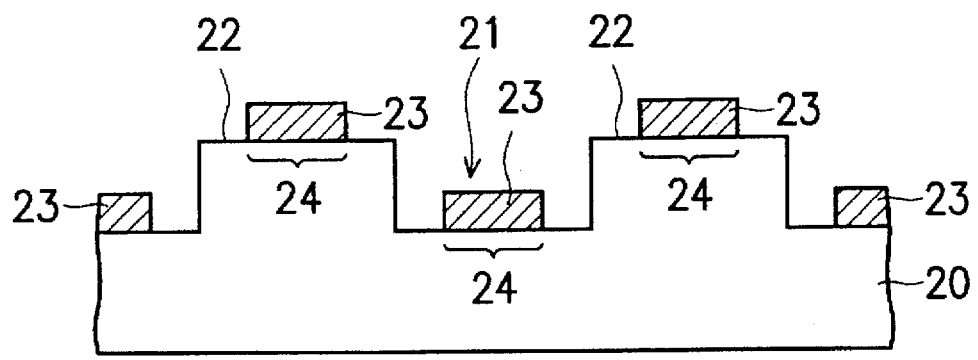
FIGS. 2A–2G are schematic sectional diagrams depicting the steps involved in the method according to the invention of fabricating a ROM device having a 3-dimensional memory cell structure.

Referring first to FIG. 2A, a silicon substrate 20 is formed with a plurality of parallel, equally-spaced trenches 21 thereon. Raised portions 22, which are hereinafter referred to as mesa regions, are thus defined between the trenches 21. In the preferred embodiment, the height of the mesa regions 22 from the surface of a trench 21 is equal to about half the width of the trenches 21. Low-pressure chemical-vapor deposition (LPCVD) is then used to deposit a layer of silicon nitride 23 to a thickness of about 1,500 Å to about 3,000 Å over the wafer. The silicon nitride layer 23 is subsequently partly etched away by a lithographic process and etching so as to define a plurality of channel regions 24 on the silicon substrate 20.

Figure 2B:
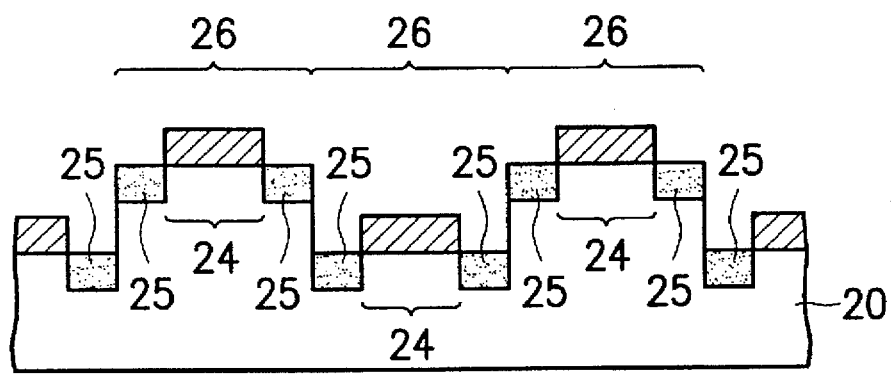

Referring next to FIG. 2B, in a subsequent step the silicon nitride layer 23 is used as a mask for ion implantation on the silicon substrate 20. In the preferred embodiment, the ion implantation process utilizes a source of arsenic (As) ions having an energy in the range of about 50 to about 100 KeV to implant such ions to a concentration in the range of about $1\times10^{14}$ to about $1\times10^{16}$ atoms/cm$^2$. Alternatively, a source of phosphorus (P) ions having an energy in the range of about 20 to about 60 KeV can be used to implant such ions to a concentration in the range of about $1\times10^{14}$ to about $1\times10^{16}$ atoms/cm$^2$ can be used instead. Through the ion implantation process, a plurality of source/drain regions 25 which are to be connected to the bit lines of the ROM device are formed on the trenches 21 and on the mesa regions 22. Each neighboring pair of source/drain regions 25 and the in-between channel 24 on the trenches 21 and on the mesa regions 22, in combination constitute a horizontal memory cell 26 (so named because their channels 24 are orientated in a horizontal direction).

Figure 2C:
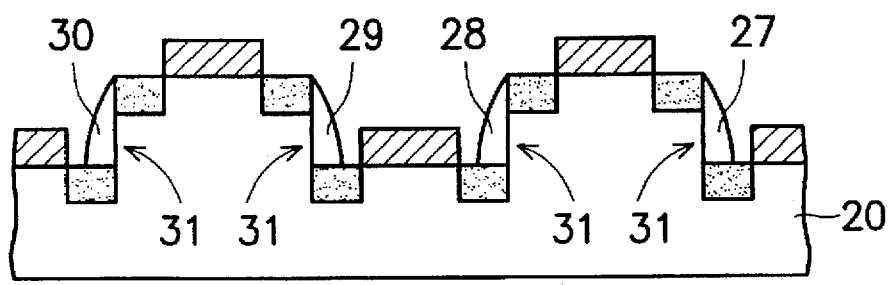

Referring next to FIG. 2C, in a subsequent step an oxide layer is formed over the wafer which is then back etched so as to form sidewall spacers 27, 28, 29, 30 on the lateral sides of the mesa regions 22. Vertically-oriented channel regions 31 are thus defined on the lateral sides of the mesa regions 22. On each lateral side of the mesa regions 22, the channel region 31 is combined with the adjoining two source/drain regions to form a vertical memory cell (so named because their channels 31 are orientated in a vertical direction).

Figure 2D:
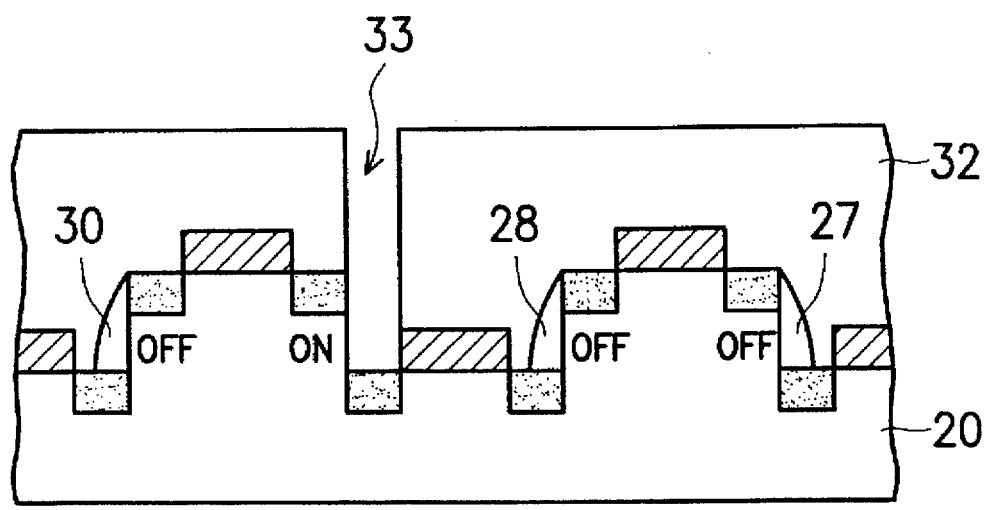

Referring next to FIG. 2D, in a subsequent step the vertical memory cells are programmed with binary information. In the example illustrated here, the three vertical memory cells that are covered by the sidewall spacers 27, 28, and 30 are to be programmed into a permanently OFF state and the vertical memory cell that is covered by the sidewall spacer 29 is to be programmed into permanently ON state. To achieve such a programming scheme, a photoresist mask 32 is defined in such a way as to cover the sidewall spacers 27, 28, and 30 while exposing the sidewall spacer 29 through an opening 33 in the photoresist mask 32. This allows the sidewall spacer 29 to be removed by etching through the photoresist mask 32. After that, the photoresist mask 32 is removed. The remaining sidewall spacers 27, 28, and 30 on the wafer allow the associated vertical memory cells to be programmed into a permanently OFF state (these memory cells are programmed OFF by allowing them to remain OFF) while the removal of the sidewall spacer 29 allows the associated vertical memory cell to be programmed into a permanently ON state.

Figure 2E:
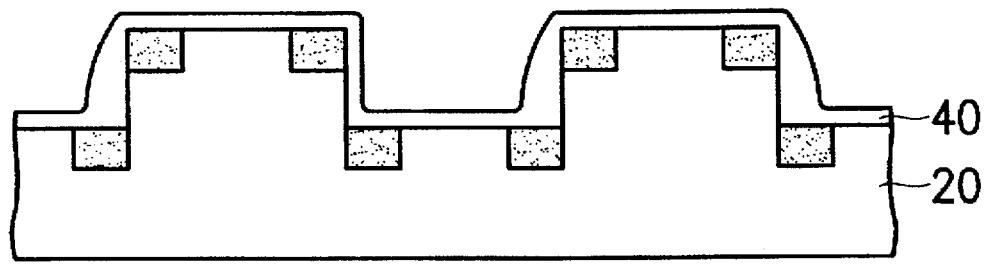

Referring next to FIG. 2E, in the subsequent step the silicon nitride layer 23 is removed. After that, a gate oxide layer 40 is deposited over the entire wafer (the substrate 20 and all its additional elements) to a thickness in the range of about 50 Å to about 250 Å.

Figure 2F:
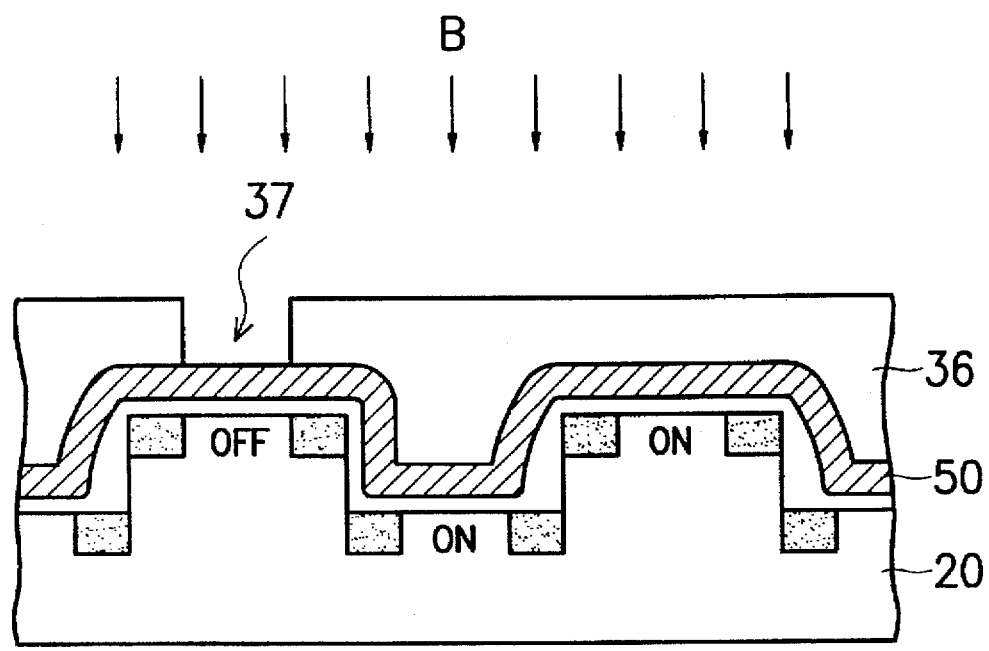

Referring next to FIG. 2F, in the subsequent step a polysilicon layer 50 is deposited over the gate oxide layer 40 to a thickness in the range of about 1,500 Å to about 3,000 Å. The polysilicon layer 50 is then treated using a lithographic process and etching so as to define a plurality of gate layers serving as word lines along a direction perpendicular to the orientation of the trenches 21 and the mesa regions 22. To program the horizontal memory cells, a photoresist mask 36 is formed over the wafer in such a way as to cover selected channel regions. The selected channel regions have associated horizontal memory cells that are to be programmed into a permanently ON state (these memory cells are programmed ON by allowing them to remain ON). The channel region that is to be programmed into a permanently OFF state is exposed through an opening 37. An ion implantation process is then performed by using a source of boron (B) ions with an energy in the range of about 100 to about 200 KeV to implant such ions to a concentration in the range of about $1\times10^{13}$ to about $1\times10^{15}$ atoms/cm$^2$ through the opening 37 in the photoresist mask 36 to close the channel under the opening 37, programming the associated memory cell into a permanently OFF state.

Figure 2G:
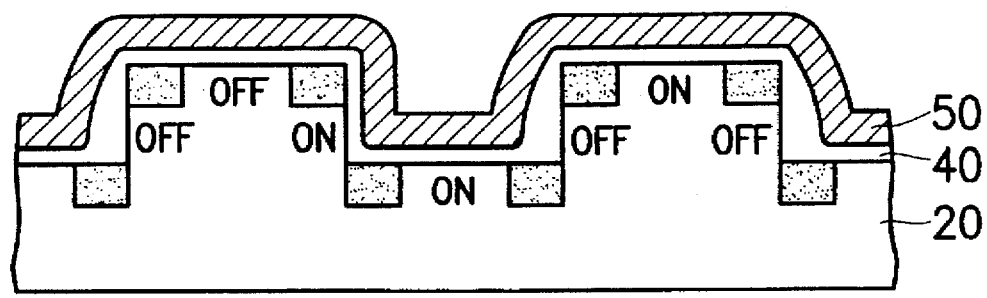

Referring to FIG. 2G, the photoresist mask 36 is removed and the ROM device is completed by forming metallization layers (not shown) serving as conductive paths on the wafer to interconnect the memory cells.

In summary, the invention provides a 3-dimensional memory cell structure in the ROM device. Furthermore, ion implantation and upright sidewall spacers on the lateral sides of the mesa regions on the substrate are used to define the permanently ON/OFF state for each vertical memory cell in the ROM device. Ion implementation and a photoresist mask on the upward facing surfaces of the mesa regions and trenches are used to define the permanently ON/OFF state for each horizontal memory cell in the ROM device. It is an apparent benefit of the invention that, since the memory cells are formed in a 3-dimensional memory cell structure over the substrate, the packing density of the memory cells on the ROM device is significantly increased over that of a typical ROM device, which has a 2-dimensional memory cell structure and thus is limited to a horizontal memory cell population.

The invention has been described above with exemplary preferred embodiments. However, it is to be understood that the scope of the invention is not limited to the disclosed preferred embodiments. To the contrary, it is intended to cover various modifications and similar arrangements as would be appreciated by those skilled in the art. The scope of the claims therefore should be accorded the broadest interpretation so as to encompass all such modifications and similar arrangements.

What is claimed is:

1. A method for fabricating a ROM device having a three-dimensional memory cell structure, comprising the steps of:

(1) forming a plurality of parallel trenches in a substrate in a first horizontal direction, the plurality of trenches defining a plurality of mesa regions therebetween;

(2) depositing a layer of silicon nitride over the silicon substrate and partly etching away the silicon nitride layer to define a plurality of channel regions on the trenches and mesa regions;

(3) performing a first ion implantation process, using the silicon nitride layer as a mask, to define a plurality of source/drain regions on the silicon substrate, including horizontally adjacent source/drain regions and vertically adjacent source/drain regions, with horizontally oriented memory cells located between horizontally adjacent source/drain regions and vertically oriented memory cells located between vertically adjacent source/drain regions;

(4) forming a plurality of sidewall spacers on lateral sides of the plurality of mesa regions, covering the vertically oriented memory cells;

(5) selectively removing at least one of the plurality of sidewall spacers, then programming each of the vertically oriented memory cells remaining covered by sidewall spacers into a permanently OFF state, and programming each of the vertically oriented memory cells not covered by sidewall spacers into a permanently ON state;

(6) removing the silicon nitride layer and then forming a gate oxide layer over the silicon substrate;

(7) depositing a polysilicon layer over the trenches and the mesa regions in a second horizontal direction substantially perpendicular to the first horizontal direction, so as to define a plurality of word lines; and (8) performing a second ion implantation process on selected horizontally oriented memory cells to program the selected horizontally oriented memory cells into a permanently OFF state and further to program the unselected horizontally oriented memory cells into a permanently ON state.

2. A method as claimed in claim 1, wherein in said step (2) the silicon nitride layer is deposited to a thickness in the range of about 1,500 Å to about 3,000 Å.

3. A method as claimed in claim 1, wherein in said step (3) the first ion implantation process utilizes a source of arsenic ions having an energy in the range of about 50 to about 100 KeV and implants the arsenic ions to a concentration in the range of about $1 \times 10^{14}$ to about $1 \times 10^{x}$ atoms/cm$^2$.

4. A method as claimed in claim 1, wherein in said step (3) the first ion implantation process utilizes a source of phosphorus ions having an energy in the range of about 20 to about 60 KeV and implants the arsenic ions to a concentration in the range of about $1 \times 10^{14}$ to about $1 \times 10^{16}$ atoms/cm$^2$.

5. A method as claimed in claim 1, wherein in said step (6) the gate oxide layer is deposited to a thickness in the range of about 50 to about 250 Å.

6. A method as claimed in claim 1, wherein in said step (8) the second ion implantation process utilizes a source of boron ions having an energy in the range of about 100 to about 200 KeV and implants the boron ions to a concentration in the range of about $1 \times 10^{13}$ to about $1 \times 10^{15}$ atoms/cm$^2$.

7. A method for fabricating a ROM device having a three-dimensional memory cell structure, comprising:

(A) forming, on a substrate, a plurality of horizontally oriented memory cells located between horizontally adjacent source/drain regions, and a plurality of vertically oriented memory cells located between vertically adjacent source/drain regions;

(B) programming selected vertically oriented memory cells into a permanently ON state; and (C) programming selected horizontally oriented memory cells into a permanently OFF state.

* * * * *